(12) United States Patent
Ge et al.

(10) Patent No.: US 10,585,541 B2
(45) Date of Patent: Mar. 10, 2020

(54) DISPLAY

(71) Applicant: HEWLETT-PACKARD DEVELOPMENT COMPANY, L.P., Houston, TX (US)

(72) Inventors: Ning Ge, Palo Alto, CA (US); Ya-Ling Chang, Palo Alto, CA (US); Helen A. Holder, Palo Alto, CA (US)

(73) Assignee: Hewlett-Packard Development Company, L.P., Spring, TX (US)

(*) Notice: Subject to any disclaimer, the term of this patent is extended or adjusted under 35 U.S.C. 154(b) by 0 days.

(21) Appl. No.: 16/079,139

(22) PCT Filed: Oct. 28, 2016

(86) PCT No.: PCT/US2016/059260
§ 371 (c)(1),
(2) Date: Aug. 23, 2018

(87) PCT Pub. No.: WO2018/080512
PCT Pub. Date: May 3, 2018

(65) Prior Publication Data
US 2019/0042026 A1 Feb. 7, 2019

(51) Int. Cl.
G06F 3/044 (2006.01)
G06F 3/041 (2006.01)
G09G 3/32 (2016.01)
H01L 27/12 (2006.01)

(52) U.S. Cl.
CPC ............ *G06F 3/044* (2013.01); *G06F 3/0412* (2013.01); *G06F 3/0416* (2013.01); *G09G 3/32* (2013.01); *H01L 27/1292* (2013.01)

(58) Field of Classification Search
CPC ...... G06F 3/0412; G06F 3/0416; G06F 3/044; G09G 3/32; H01L 27/1292
See application file for complete search history.

(56) References Cited

U.S. PATENT DOCUMENTS

| 8,890,853 | B2 | 11/2014 | Schuele et al. |
| 9,153,171 | B2 | 10/2015 | Sakariya et al. |
| 2012/0196053 | A1 | 8/2012 | Coull et al. |
| 2013/0002593 | A1 | 1/2013 | Miller et al. |
| 2014/0354597 | A1 | 12/2014 | Kitchens, II et al. |
| 2015/0155077 | A1* | 6/2015 | Yamazaki ................ H01B 1/04 174/257 |
| 2015/0310793 | A1 | 10/2015 | Kawashima et al. |
| 2016/0064363 | A1 | 3/2016 | Bower et al. |
| 2016/0299387 | A1* | 10/2016 | Yamazaki ........... H01L 27/3232 |
| 2017/0358637 | A1* | 12/2017 | Lee .................... H01L 27/3251 |
| 2019/0115474 | A1* | 4/2019 | Yamazaki ............. G02F 1/1368 |

OTHER PUBLICATIONS

Brown et al., "A System LCD with Integrated Infra-Red Sensing Optical Touch Panel", Retrieved from internet—http://www.sle.sharp.co.uk/sharp/apps/sle-web/research/displays_embedded_systems/file9.pdf, 2009, 4 Pages.

* cited by examiner

*Primary Examiner* — Dmitriy Bolotin
(74) *Attorney, Agent, or Firm* — Rathe Lindenbaum LLP

(57) ABSTRACT

A display may include a substrate, an array of thin film transistors, an array of micro-light-emitting diode elements supported by the substrate and an array of sensing elements supported by the substrate. Each sensing element may include a continuous conductive layer functioning as part of the sensing element and extending along the substrate as an electrically conductive trace connected to one of the thin film transistors.

19 Claims, 3 Drawing Sheets

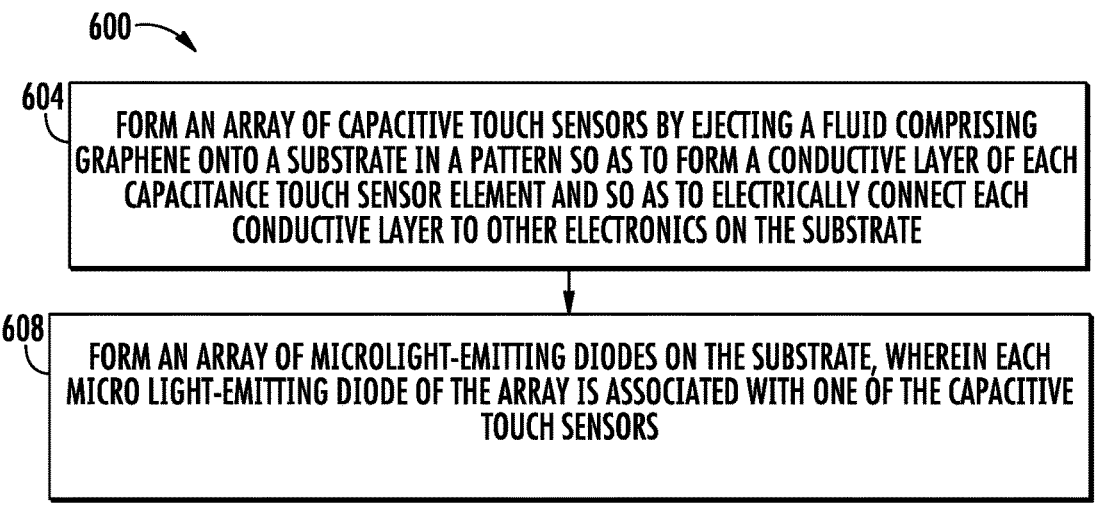
FIG. 10
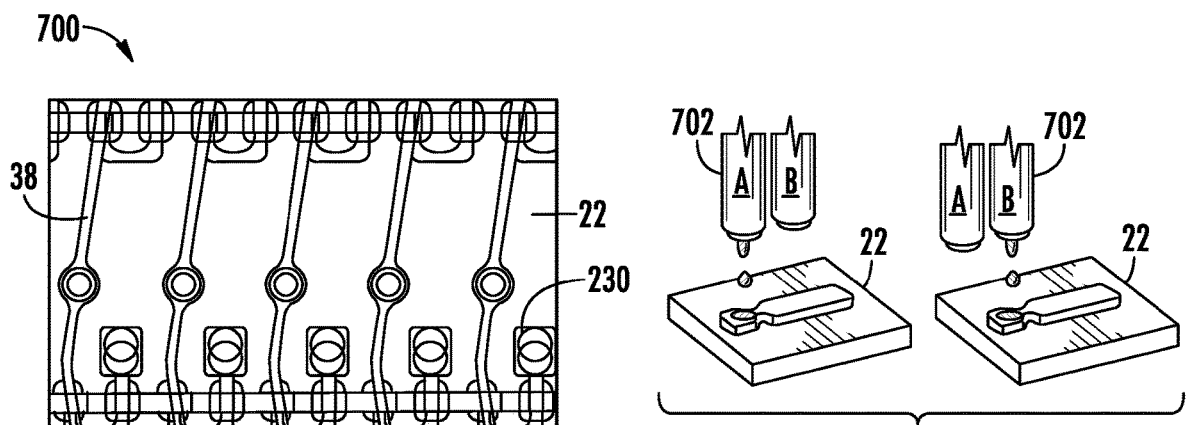
FIG. 11A
FIG. 11B
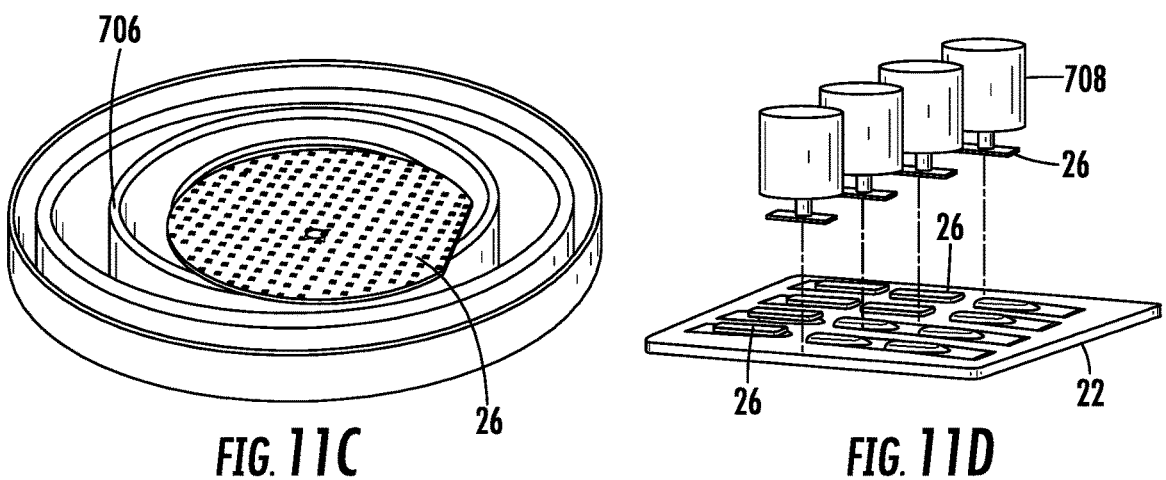
FIG. 11C
FIG. 11D

DISPLAY

BACKGROUND

Displays are employed in a wide variety of electronic devices such as monitors, smart phones, laptops and the like. Many of such displays include light emitting diodes. Touch screen displays provide a user with the ability to input commands and selections by simply touching the display.

BRIEF DESCRIPTION OF THE DRAWINGS

FIG. 10 is a flow diagram of an example method for forming an example display.

FIGS. 11A-11D illustrate an example method for forming portions of a display. FIG. 11A is a top view of an example substrate having an example arrangement of thin film transistors.

FIG. 11B or perspective views illustrating layer-bi-layer jetting of portions of sensing elements, such as capacitive touch sensors, onto the substrate of FIG. 11A.

FIG. 11C is a perspective view illustrating the simulation and lift off of individual micro light-emitting device elements from a wafer.

FIG. 11D is a perspective view illustrating the picking and placing of the simulated micro light-emitting device elements of FIG. 11C onto the printed upon substrate of FIG. 11B.

DETAILED DESCRIPTION OF EXAMPLES

Disclosed herein are examples of a display that may incorporate additional sensing elements to provide enhanced operation of the display. Disclosed herein are examples of a display, wherein the additional sensing elements sense the surrounding environment to provide enhanced operation of the display. According to one example, the additional sensing elements comprise touch sensors, allowing the display to serve as a touchscreen. The example displays have architectures that allow the addition of such sensing elements without substantially increasing the cost or complexity of the display.

Disclosed herein is an example display that may comprise a substrate, an array of thin film transistors, an array of micro-light-emitting diode elements supported by the substrate and an array of sensing elements (SE) supported by the substrate. Each electronic element comprising a continuous conductive layer functioning as part of the electronic element and extending along the substrate as an electrically conductive trace connected to one of the thin film transistors.

Disclosed herein is an example method for forming a display. The example method comprises ejecting fluid through at least one nozzle onto a substrate supporting an array of thin film transistors so as to form printed electronics on the substrate, placing micro light-emitting diode elements on the substrate and bonding the micro light-emitting diode elements to the thin film transistors supported by the substrate.

Disclosed herein is an example method for forming a display, wherein an array of capacitive touch sensors are formed by ejecting a fluid comprising graphene onto a substrate in a pattern so as to form a conductive layer of each capacitance touch sensor element and so as to electrically connect each conductive layer to other electronics on the substrate. An array of micro light-emitting diodes is formed on the substrate, wherein each micro light-emitting diode of the array is associated with one of the capacitive touch sensors.

Figure 1:
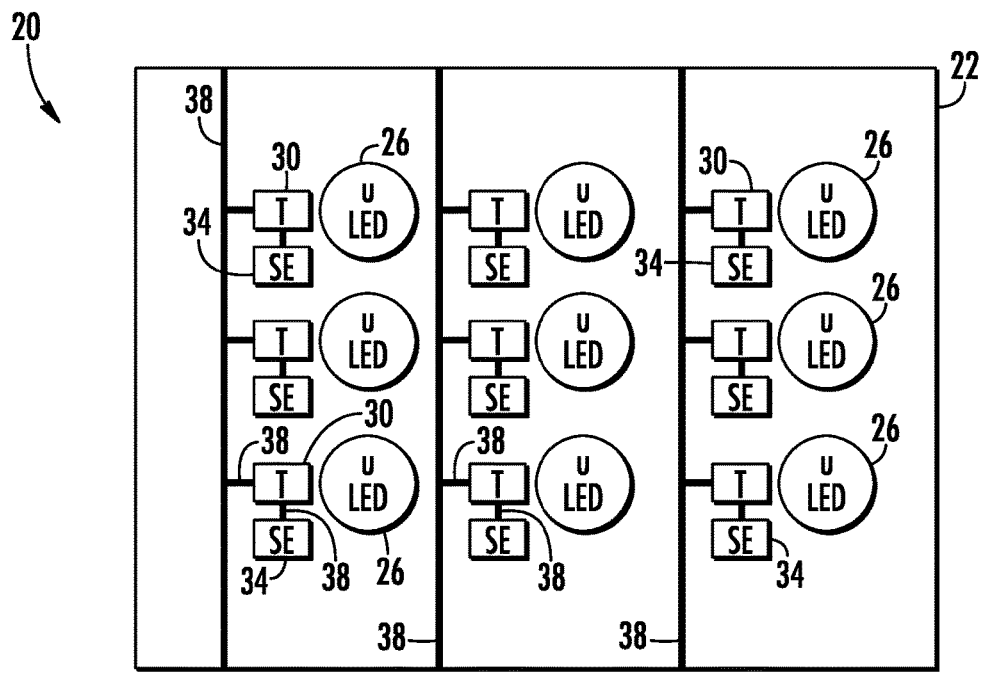
FIG. 1 is a schematic diagram of an example display.
Figure 2:
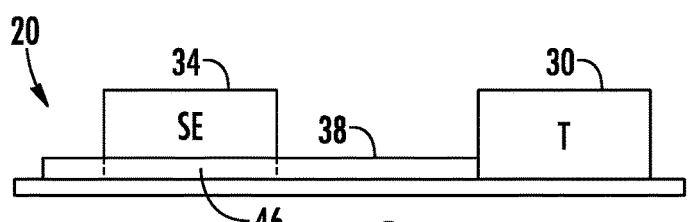
FIG. 2 is a sectional view of a portion of the example display of FIG. 1.
Figure 3:
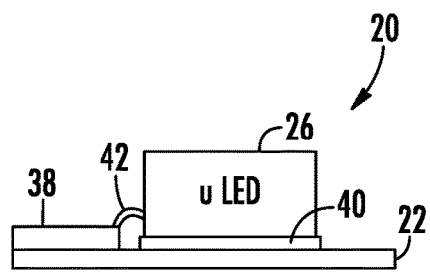
FIG. 3 is a sectional view of another portion of the example display of FIG. 1.

FIGS. 1-3 schematically illustrate an example display 20. Display 20 incorporates additional sensing elements to provide enhanced operation of the display 20. In the example illustrated, the additional sensing elements sense the surrounding environment to provide enhanced operation of the display 20. In the example illustrated, the additional sensing elements comprise touch sensors, allowing the display 20 to serve as a touchscreen. As will be described hereafter, the example display 20 has an architecture that allows the addition of such sensing elements without substantially increasing the cost or complexity of the display 20. Display 20 comprises substrate 22, micro light-emitting diode elements 26, thin film transistors (T) 30, sensing elements 34 and electrically conductive traces 38 (schematically illustrated with thick lines).

Substrate 22 comprises a physical platform upon which transistors 26, micro light-emitting diode elements 26, sensing elements 34 and electrically conductive traces 38 are supported. In one implementation, substrate 22 is formed as part of a circuit board. In one implementation, substrate 22 may be formed from silicon. In another implementation, substrate 22 may be formed from other materials such as a polymer, glass or ceramic based material.

Micro light-emitting diode elements 26 (schematically shown) comprise miniaturized light emitting diodes arranged in an array across substrate 22. In one implementation come each micro light-emitting diode comprises a two-lead semiconductor light source, such as a P-N junction diode which emits light when activated. As shown by FIG. 3, in one implementation, micro light-emitting diode elements 26 are assembled through a pick and place method to substrate 22 by a bonding or adhesive layer 40. Each micro light-emitting diode element 26 is further electrically connected to an existing or underlying portion of electrically conductive trace 38 by an electrical bond connection 42. In one implementation, the electrical bond connection 42 comprises a soldered electrically conductive material interconnecting leads or contact pads of the micro light-emitting diode element 26 and traces 38 or electrical contact pads of substrate 22 that are connected to traces 38.

In such an implementation, micro light emitting diode elements 26 may be formed as part of a wafer, wherein the individual micro light-emitting diodes or diode elements 26 are simulated and lifted off or from the wafer and placed onto substrate 22. In one implementation, substrate 22 may already have formed thereon traces 38 and transistors 30 at the time that micro light-emitting diode elements 26 are positioned on substrate 22 and bonded to substrate 22.

Transistors 26 (schematically shown) comprise electronic switches arranged in an array on substrate 22. Transistors 26 facilitate control over the transmission of signals to and from sensing elements 34. In one implementation, transistors 26 comprise thin film transistors formed upon substrate 22. In the example illustrated, display 20 may further include additional transistors that facilitate control or activation of micro-light-emitting diode elements 26.

Sensing elements 34 comprise individual electronic components that are arranged in array on substrate 22. In one implementation, sensing elements 34 comprise sensing elements. In one implementation sensing elements 34 comprise elements that sense ambient light or temperature (a thermo sensor). In another implementation, sensing elements 34 comprise sensors, such as touch sensors, that sense the proximity to or contact with a person. In one implementation, sensing elements, such as capacitive touch sensors, have sizes (areas) of the micron level (less than 1000 square microns).

As shown by FIG. 2, in one implementation, each sensing elements 34 (schematically shown) comprises a continuous conductive layer 46 that not only functions as part of the electronic element 34, but extends beyond electronic element 34, along substrate 22, forming at least part of electrically conductive trace 38. For example, in one implementation, each electronic element 34 may comprise a capacitive touch sensor, wherein the continuous conductive layer 46 forms the conductive plate or conductive layer of the capacitor which serves as the touch sensor.

In one implementation, continuous conductive layer 46 is deposited as a single layer on substrate 22, forming both portions of sensing elements 34 as well as portions of electrically conductive trace 38. Layer 46 is deposited directly upon substrate 22 without any intervening bonding material or bonding layer. For example, in one implementation, the continuous conductive layer 46 may be patterned on substrate 26 so as to concurrently form portions of multiple sensing elements 34 and a network or circuit of electrically conductive traces 38 connecting each of the sensing elements 34 to transistors 30 or other electronic components supported by substrate 22.

In one implementation, the continuous conductive layer 46 of electronic element 34, that also forms an electrically conductive trace 38, is formed from an electrically conductive material having characteristics facilitating its deposition using fluid jetting printing, such as drop-on-demand printing. One example of such a fluid jetting printer or drop-on-demand printer is a bubble jet printer that utilizes thermal resistors to vaporize fluid to create a bubble that ejects remaining fluid through a nozzle in the form of a droplet. Another example of such fluid jetting printer is a piezo resistive printer, wherein an electrical current cause the membrane to deflect, expelling fluid from a chamber through a nozzle in the form of a droplet. In still other implementations, the continuous conductive layer 46 may be printed by other fluid jetting or drop-on demand printers.

In one implementation, the electrically conductive material having characteristics facilitating its deposition using fluid jetting printing, such as drop-on-demand printing, comprises a transparent electrically conductive material such as graphene. For example, the graphene material may be carried by a solvent or other liquid which is jetted as droplets on to substrate 22. Graphene is both transparent and flexible, facilitating the forming flexible displays. In one implementation, the graphene material forming sensing element 34 has a Young's modulus (measured with a graphene sheet having a thickness of between 2 and 8 Nm) of at least 0.5 to 1 TPa. As a result, sensing element 34 is well suited for use in a flexible display. In one implementation, the continuous conductive layer 46 is a homogenous material. In other implementations, continuous conductive layer has a varied or non-uniform composition. In yet other implementations, other transparent materials which are suitable for fluid jetting or drop-on-demand for forming a conductive layer of a sensing element include, but are not limited to, carbon nano-tubes, indium tin oxide and poly(3,4-ethylenedioxythiophene) polystyrene sulfonate (PEDOT:PSS).

Figure 4:
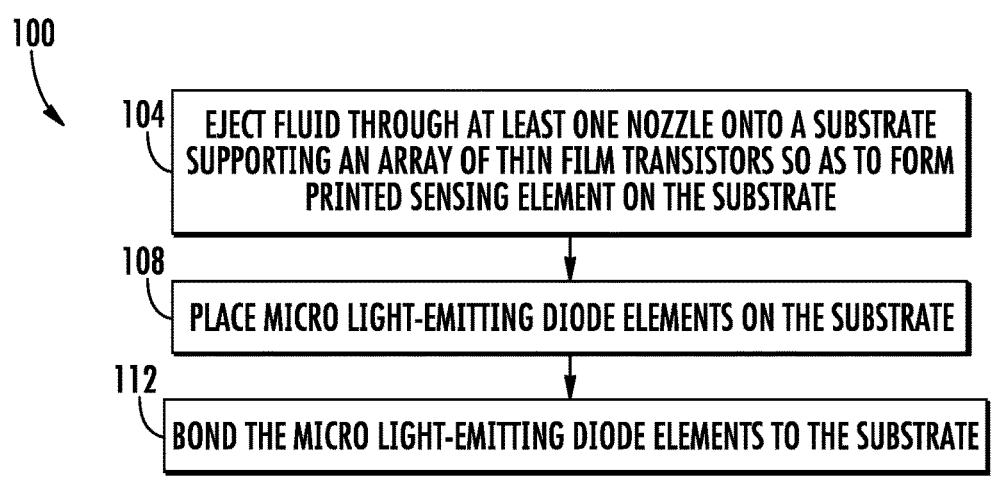
FIG. 4 is a flow diagram of an example method for forming a display.

FIG. 4 is a flow diagram of an example method 100 that may be utilized to form a display. Method 100 facilitates the forming of a display that is less complex and less costly. Although method 100 is described in the context of forming display 20 described above, it should be appreciated that method 100 may be carried out to form any of the displays disclose in the present disclosure as well as other displays having similar architectures.

As indicated by block 104, fluid is ejected through at least one nozzle onto a substrate 22 supporting a pre-existing or preformed array of thin film transistors, such as transistors 30, so as to form printed electronics on the substrate. In one implementation, the printed electronics comprise sensing elements, such as sensing elements 34 described above. In one implementation, sensing elements 34 may comprise sensing elements that sense surroundings.

In one implementation, the printed electronics may comprise touch sensors, such as capacitive touch sensors. In one implementation, the touch sensors may comprise a dielectric layer sandwiched between a pair of opposite capacitive plates or conductive layers, wherein the dielectric layer and each of the pair of opposite conductive layers are printed upon the substrate. For example, each of the layers may be printed using liquid or fluid jetting or drop-on-demand printing, such as bubble jet printing.

In one implementation, the conductive layers comprise a conductive material to facilitate such printing, such as graphene. In one implementation, the dielectric layer comprises a dielectric material to facilitate such printing, such as Boromitrene (hBN), sometimes referred to as white graphene. In yet other implementations, such conductive and dielectric layers may be formed from other electrically conductive materials or dielectric materials having compositions that facilitate their deposition through fluid printing.

As indicated by block 108, micro light-emitting diode elements, such as elements 26 described above, are placed on the substrate, such as substrate 22. As indicated by block 112, the placed micro light-emitting diode elements 34 are bonded to the substrate 22. In one implementation, such bonding is followed up by electrically connecting the secured micro light-emitting devices to electrically conductive traces and thin film transistor supported by the substrate.

The printing of the electronics or sensing elements 34 facilitates a more compact arrangement of such sensing elements on substrate 22. In the case where the sensing elements comprise touch sensors, such printing provides the display, such as display 20, with a greater sensing resolution. In one implementation, each micro light-emitting diode 26 may be provided with an associated individual electronic element 34, such as an individual touch sensor. As a result, display 20 has a greater touch sensitivity resolution. Such printing of sensing elements 34 further simplifies fabrication and reduces cost.

Figure 5:
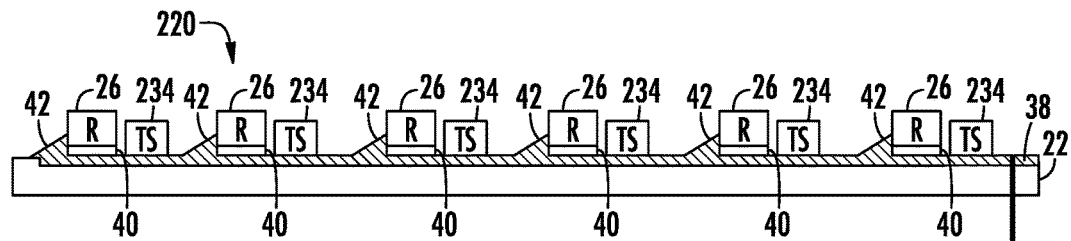
FIG. 5 is a sectional view of another example display.
Figure 6:
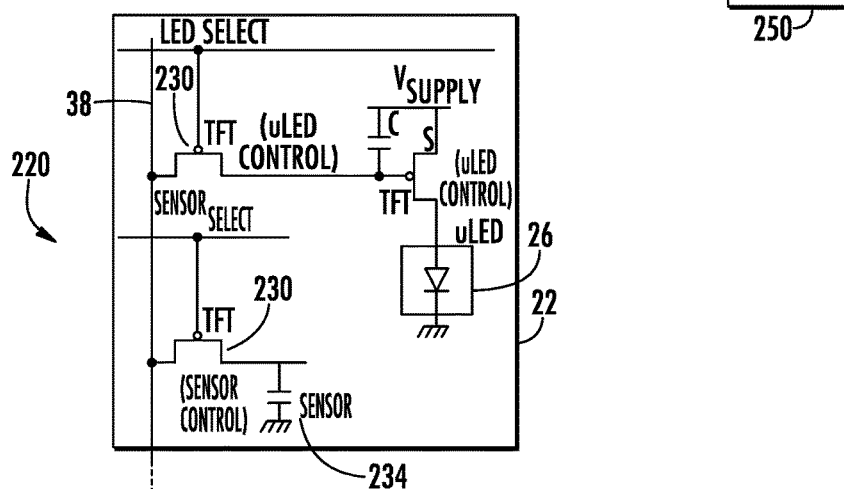
FIG. 6 is a circuit diagram of an individual pixel of the example display of FIG. 5.

FIGS. 5 and 6 illustrate an example display 220. Display 220 is similar to display 20 described above except that display 220 is specifically illustrated as having sensing elements in the form of touch sensors (TS) 234. As shown by FIG. 5, display 220 comprises an array of micro light-emitting diode elements 26. Each micro light-emitting diode element 26 is bonded to the underlying substrate by bonding or adhesive layer 40 and is electrically connected to the electric conductive trace 38 by an electrical bond connection 42 (described above). Electric conductive trace 38 is electrically connected to drive electronics or a display driving circuit (DC) 250. In one implementation, the different micro light-emitting diode elements 26 comprise red, green and blue diode elements. In another implementation, the different micro light-omitting diet elements 26 comprise signals/Mono color micro light-emitting diode elements, wherein different adjacent film elements provide full color.

FIG. 6 is a circuit diagram illustrating electronic circuitry of one example pixel of display 220. As shown by FIG. 6, electrically conductive traces 38 on circuit board 22 are electrically connected to drive circuit 250, wherein activation of micro light-emitting diode element 26 and touch sensor 234 is facilitated through use of transistors 230. The layout illustrated in FIG. 6 is repeated across substrate 22 to form display 220. In other implementations, display 220 may comprise a different layout or architecture of light-emitting diode elements 26, transistors 230 and touch sensors 234.

Figure 7:
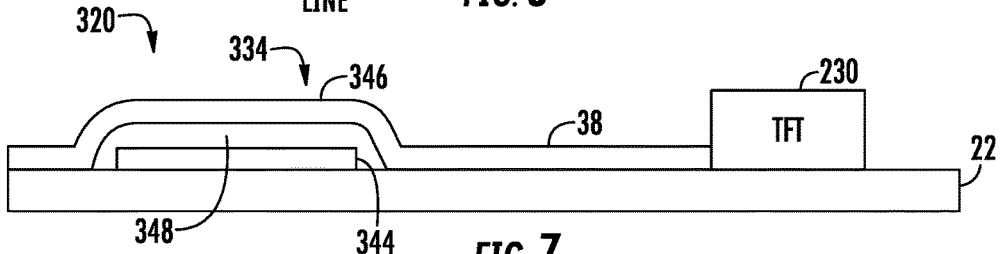
FIG. 7 is a sectional view of a portion of another example display, illustrating an example capacitive touch sensor.

FIG. 7 is a sectional view of a portion of an example display 320. Display 320 is similar to display 20 and display 220 described above except that display 320 is illustrated as specifically comprising an electronic element, shown as capacitive touch sensor 334. Like displays 20 and 220, display 320 comprises micro light-emitting diodes 26 that are bonded to substrate 22 by bonding adhesive layer 40 and that are electrically connected to the electric conductive trace 38 by an electrical bond connection 42 (as described above and illustrated in FIGS. 3 and 5).

As shown by FIG. 7, capacitive touch sensor 334 comprises capacitive plates 344, 346 separated by an intervening dielectric layer 348. In one implementation, plates 344, 346 as well as intervening dielectric layer 348 are formed by jetting or drop-on-demand printing. In one implementation, the conductive layers forming plates 344, 346 comprise a conductive material to facilitate such printing, such as graphene. In one implementation, the dielectric layer 348 comprises a dielectric material to facilitate such printing, such as Boromitrene (hBN), sometimes referred to as white graphene. In yet other implementations, such conductive and dielectric layers may be formed from other flex conductive materials or dielectric materials having compositions that facilitate their deposition through fluid printing.

As further shown by 7, dielectric layer 348 is printed upon substrate 22 and over top of plate 344 so as to separate and electrically insulate plate 344 from plate 346. The continuous layer of electrically conductive material forming plate 346 and functioning as part of capacitive touch sensor 334 extends beyond touch sensor 334 and forms portions of electrically conductive trace 38. The continuous layer of electrically conductive material forming portions of capacitive touch sensor 334 and electrically conductive trace 38 extends along substrate 22 into electrical contact with thin film transistor 230 (schematically illustrated). As a result, a single printing process may be utilized to concurrently form conductive plate 346 of capacitive touch sensor 334, an electrically conductive trace 38, connecting thin film transducer 230 to capacitive touch sensor 334. As indicated above, the print ability of capacitive touch sensor 334 concurrently with trace 38 facilitates a more compact and dense array of capacitive touch sensors 334 with less complexity and lower cost. As a result, capacitive touch sensor 334 may be provided closer to the micro light-emitting diodes 26. In some implementations, the capacitive touch sensor 334 may be provided for each micro light-emitting diode 26, providing a high degree of touch resolution.

Figure 8:
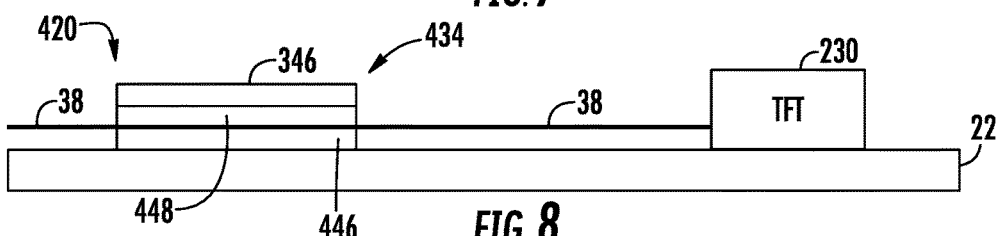
FIG. 8 is a sectional view of a portion of another example display, illustrating another example capacitive touch sensor.

FIG. 8 is a sectional view of a portion of an example display 420. Display 420 is similar to displays 20, 220 and 320 described above except that display 420 is illustrated as specifically comprising an electronic element, shown as capacitive touch sensor 434. Like displays 20, 220 and 320, display 420 comprises micro light-emitting diodes 26 that are bonded to substrate 22 by bonding adhesive layer 40 and that are electrically connected to the electric conductive trace 38 by an electrical bond connection 42 (as described above and illustrated in FIGS. 3 and 5).

As shown by FIG. 8, capacitive touch sensor 434 comprises capacitive plates 444, 446 separated by an intervening dielectric layer 448. In one implementation, plates 444, 446 as well as intervening dielectric layer 448 are formed by jetting or drop-on-demand printing. In one implementation, the conductive layers forming plates 444, 446 comprise a conductive material to facilitate such printing, such as graphene. In one implementation, the dielectric layer 448 comprises a dielectric material to facilitate such printing, such as Boromitrene (hBN), sometimes referred to as white graphene. In yet other implementations, such conductive and dielectric layers may be formed from other flex conductive materials or dielectric materials having compositions that facilitate their deposition through fluid printing.

As further shown by 8, dielectric layer 448 is printed upon substrate 22 and over top of plate 446 so as to separate and electrically insulate plate 444 from plate 446. The continuous layer of electrically conductive material forming plate 446 and functioning as part of capacitive touch sensor 434 extends beyond touch sensor 434 and forms portions of electrically conductive trace 38. The continuous layer of electrically conductive material forming portions of capacitive touch sensor 434 and electrically conductive trace 38 extends along substrate 22 into electrical contact with thin film transistor 230 (schematically illustrated). As a result, a single printing process may be utilized to concurrently form conductive plate 446 of capacitive touch sensor 334, an electrically conductive trace 38, connecting thin film transducer 230 to capacitive touch sensor 434. As indicated above, the print ability of capacitive touch sensor 434 concurrently with trace 38 facilitates a more compact and dense array of capacitive touch sensors 434 with less complexity and lower cost. As a result, capacitive touch sensor 434 may be provided closer to the micro light-emitting diodes 26. In some implementations, the capacitive touch sensor 434 may be provided for each micro light-emitting diode 26, providing high degrees of touch resolution.

Figure 9:
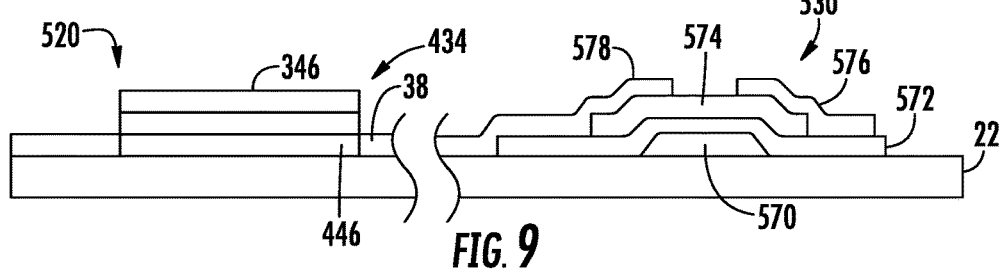
FIG. 9 is a sectional view of a portion of another example display, illustrating an example capacitive touch sensor and an example thin film transistor of the display.

FIG. 9 is a sectional view illustrating portions of an example display 520. Display 920 is similar to display 420 described above except that display 520 is specifically illustrated as comprising thin film transistor 530. Transistor 530 is formed upon substrate 22 and comprises gate 570, gate insulator 572, semiconductor 574, source 576 and drain 578. Gate 570 comprises a layer of electrically conductive material connected to a source of electrical current for activating transistor 530. Gate insulator 572 comprises a layer of dielectric material insulating gate 570 from semiconductor 574 and from source 576, drain 578. Semiconductor 574 comprises a layer of semi conductive material bridging between source 576 and drain 578. Semiconductor 574 switches from a non-conducting state to a conducting state in response to an electric field applied by gate 570. By selectively supplying such an electrical field using gate 570, transistor 530 may be turned on and off to control the operation of capacitive touch sensor 434.

In the example illustrated, the continuous electrically conductive layer which forms conductive plate 446 and trace 38 may further extend and form drain 578 of transistor 530. In some implementations, the continuous electrically conductive layer may also form source 576, wherein source 576 and drain 578 are separated by a gap across semiconductor 574. As described above with respect to display 420, in one implementation, the continuous electrically conductive layer forming at least source 576 may be formed by jetting or drop-on-demand printing. In one implementation, the conductive layers forming source 576 may comprise a conductive material to facilitate such printing, such as graphene. In yet other implementations, such the continuous conductive layer may be formed from other electrically conductive materials having compositions that facilitate their deposition through fluid printing.

As shown by FIG. 9, a single printing process may be utilized to concurrently form conductive plate 446 of capacitive touch sensor 334, an electrically conductive trace 38, connecting thin film transducer 230 to capacitive touch sensor 434 and portions of transistor 530. As indicated above, the printability of capacitive touch sensor 434 concurrently with trace 38 and portions of transistor 530 facilitates a more compact and dense array of capacitive touch sensors 434 with less complexity and lower cost. As a result, capacitive touch sensor 434 may be provided closer to the micro light-emitting diodes 26. In some implementations, the capacitive touch sensor 434 may be provided for each micro light-emitting diode 26, providing high degrees of touch resolution. For example, in one implementation, display 520, like displays 420, 320, 220 and 20 may have a touch sensing resolution of at least 100 touch sensors per inch, and in some implementations, at least 1000 touch sensors per inch.

In other implementations, display 320, described above, may be provided with thin film transistor 530. In such an implementation, the electrically conductive plate 346 of passive touch sensor 334 may be formed by a single continuous electric conductive layer that also forms trace 38 and source 576 of thin film transistor 530. As with display 520, display 320 further reduces the cost and complexity of the display while facilitating a more compact or dense arrangement of capacitive touch sensors, transistors and micro light-emitting diodes.

FIG. 10 is a flow diagram of an example method 600 for forming a touch screen or touch sensitive display. As indicated by block 604, an array of capacitive touch sensors, such as touch sensors 334 or 444, are formed by ejecting a fluid comprising graphene onto a substrate, such as substrate 22, in a pattern so as to form a conductive layer or plate 444, 446 of each capacitive touch sensor element and so as to electrically connect each conductive layer (or plate) to other electronics, such as thin film transistor 230, on the substrate. As indicated by block 608, an array of micro light-emitting diodes, such as diodes 26, is formed on substrate 22. Each micro light-emitting diode of the array is associated with one of the capacitive touch sensors. Method 600 results in a display having an individual per-pixel touch sensing resolution.

FIGS. 11A-11D illustrate an example method 700 for forming portions of a display. As illustrated by FIG. 11A, the method or process begins with substrate 22 having an array of thin film transducers 230. Such transducers may be formed on substrate 22 through photolithography or other semiconductor fabrication technologies.

As illustrated by FIG. 11B, sensing elements, such as capacitive touch sensors 234, 334 or 434 (described above) are printed directly upon substrate 22 in proximity to each of the, already formed, thin film transducers 230. The multiple layers and components of the sensing elements are formed by printing upon substrate 22 in a layer-by-layer fashion. In one implementation, such printing is done by a fluid jetting printer, such as a drop-on-demand printer 702. In one implementation, the fluid jetting printer 702 may comprise a bubble jet printer.

In one implementation, a first printed patterned layer forms a first conductive plate of a capacitive touch sensor. A second printed patterned layer, overlapping the first printed pattern, forms a dielectric layer of the capacitive touch sensor. A third printed patterned layer forms a second conductive plate of the capacitive touch sensor. In one implementation, the first printed patterned layer and the second third printed patterned layer comprise conductive materials suitable for printing through such jetting, such as graphing. In one implementation, the second printed patterned layer, forming the dielectric layer, is formed from white graphene. The white graphene is well-suited for use with the graphing material or composition forming the conductive plates of the capacitive touch sensor. In one implementation, the touch sensor may have a layout or architecture similar to that described above with respect to touch sensor 334 in FIG. 7. In another implementation, the touch sensor may have a layout or architecture similar to that described above with respect to touch sensor 434 in FIG. 8. In some implementations, additional thin film transducers, for controlling the capacitive touch sensors, maybe concurrently printed upon substrate 22 with the printing of the capacitive touch sensors, as described above with respect to FIG. 9.

As illustrated by FIG. 11C, micro light-emitting diode elements 26 are formed as part of a wafer process. The individual micro light emitting diodes 26 may be separated or severed from a larger wafer 706 through laser lift off. As illustrated by FIG. 11D, the individual micro light emitting diodes 26 may be picked and placed on substrate 22 by a robotic pick and place device 708 to form an array of such light emitting diodes 26. The array may be bonded to substrate 22 using a binding layer, such as bonding layer 40 described above. Thereafter, the individual micro light-emitting diode 26 may be electrically connected to electric conductive traces 38 (shown in FIG. 11A) of substrate 22 through the application of electrical bond connection 42 as described above.

The processor method 700 illustrated in FIGS. 11A-11D provides a low cost method for adding additional sensing devices to a micro light-emitting diode display. The method 700 facilitates a very dense or compact arrangement of sensing devices, such as capacitive touch sensors, along the display. In one implementation, each micro light-emitting diode element is provided with a corresponding or associated capacitive touch sensor, providing a high degree of touch input resolution.

Although the present disclosure has been described with reference to example implementations, workers skilled in the art will recognize that changes may be made in form and detail without departing from the spirit and scope of the claimed subject matter. For example, although different example implementations may have been described as including one or more features providing one or more benefits, it is contemplated that the described features may be interchanged with one another or alternatively be combined with one another in the described example implementations or in other alternative implementations. Because the technology of the present disclosure is relatively complex, not all changes in the technology are foreseeable. The present disclosure described with reference to the example implementations and set forth in the following claims is manifestly intended to be as broad as possible. For example, unless specifically otherwise noted, the claims reciting a single particular element also encompass a plurality of such particular elements. The terms "first", "second", "third" and so on in the claims merely distinguish different elements and, unless otherwise stated, are not to be specifically associated with a particular order or particular numbering of elements in the disclosure.

What is claimed is:

1. A display comprising:
   a substrate;
   an array of thin film transistors;
   an array of micro light-emitting diode elements supported by the substrate;
   an array of sensing elements supported by the substrate, the sensing elements being interspersed amongst the array of micro light-emitting diode elements, each sensing element comprising a continuous conductive layer functioning as part of the sensing element and extending along the substrate as an electrically conductive trace connected to one of the thin film transistors, wherein the array of micro-light-emitting diode elements and the array of sensing elements are coplanar in that a single plane intersects both the array of micro-light-emitting diode elements and the array of sensing elements.

2. The display of claim 1, wherein the continuous conductive layer comprises at least graphene.

3. The display of claim 1, wherein the sensing elements comprise touch sensor elements.

4. The display of claim 3, wherein the touch sensor elements each comprise a capacitance touch sensor element.

5. The display of claim 4, wherein the capacitance touch sensor element comprises:
   the continuous conductive layer;
   a second conductive layer; and
   a dielectric layer sandwiched between the homogenous conductive layer and the second conductive layer.

6. The display of claim 5, wherein the dielectric layer comprises white graphene (hBN) and wherein the second conductive layer comprises graphene.

7. The display of claim 6, wherein the second conductive layer is part of a homogenous layer further forming a second electrically conductive trace connected to a second one of the thin film transistors.

8. The display of claim 4, wherein each of the micro light-emitting diodes is associated with one of the touch sensor elements.

9. The display of claim 1, wherein the continuous conductive layer further forms at least one of a source and a drain of each of the thin film transistors.

10. The display of claim 1, wherein the display comprises pixels, each of the pixels comprising a different one of the micro light-emitting-diode elements and a different one of the sensing elements to provide individual per-pixel sensing.

11. The display of claim 10, wherein the pixels have a density of at least 1000 pixels per inch.

12. A method for forming a display comprising:
   ejecting fluid through at least one nozzle onto a substrate supporting an array of thin film transistors so as to form printed sensing elements on the substrate;
   placing micro light-emitting diode elements on the substrate; and
   bonding the micro light-emitting diode elements to the substrate.

13. The method of claim 12, wherein the ejecting of fluid through the at least one nozzle onto the substrate forms a single homogenous layer of fluid that forms a conductive layer that functions as part of the printed sensing elements and a trace layer that electrically connects the sensing elements to one of the thin film transistors.

14. The method of claim 13, wherein the array of touch sensor elements comprises an array of capacitive touch sensor elements.

15. The method of claim 12, wherein the sensing elements comprises an array of touch sensor elements.

16. The method of claim 15, wherein the display has a display region comprising lighting pixels formed by the micro light-emitting diodes and wherein each of the pixels has an associated touch sensor element.

17. The method of claim 12, wherein the micro light-emitting diode elements and the printed sensing elements are coplanar in that a single plane intersects both the micro-light-emitting diode elements and the sensing elements.

18. A method for forming a display comprising:
   forming an array of capacitive touch sensors by ejecting a fluid comprising graphene onto a substrate in a pattern so as to form a conductive layer of each capacitance touch sensor and so as to electrically connect each conductive layer to other electronics on the substrate;
   forming an array of a micro light-emitting diodes on the substrate, wherein each micro light-emitting diode of the array is associated with one of the capacitive touch sensors.

19. The method of claim 18, wherein the micro light-emitting diode elements and the capacitive touch sensors are coplanar in that a single plane intersects both the micro light-emitting diode elements and the capacitive touch sensors.

* * * * *